United States Patent
Chae et al.

(10) Patent No.: US 12,310,117 B2
(45) Date of Patent: May 20, 2025

(54) SEMICONDUCTOR DEVICE

(71) Applicant: SAMSUNG ELECTRONICS CO., LTD., Suwon-si (KR)

(72) Inventors: Kwan Yeob Chae, Seoul (KR); San Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 17/498,330

(22) Filed: Oct. 11, 2021

(65) Prior Publication Data

US 2022/0293584 A1  Sep. 15, 2022

(30) Foreign Application Priority Data

Mar. 12, 2021  (KR) .................. 10-2021-0032595

(51) Int. Cl.
*H10D 89/60* (2025.01)
*H03K 19/0185* (2006.01)
*H03K 19/17736* (2020.01)

(52) U.S. Cl.
CPC ....... *H10D 89/611* (2025.01); *H03K 19/0185* (2013.01); *H03K 19/17744* (2013.01)

(58) Field of Classification Search
CPC . H01L 27/0207; H01L 27/0203; H10B 10/12; H03K 19/0013; H03K 19/018521; H03K 19/17744; H03K 19/17736; H03K 3/35613; H03K 19/01721; H03K 3/356113; H03K 3/012; H03K 3/013; G11C 11/4082; G11C 11/4085; G11C 11/4072; G11C 11/4074; H10D 89/611
See application file for complete search history.

(56) References Cited

U.S. PATENT DOCUMENTS

| | | | | |
|---|---|---|---|---|
| 5,072,286 A | * | 12/1991 | Minami | ............... H10B 10/12 257/E27.099 |
| 5,414,292 A | * | 5/1995 | Williams | ............ H01L 29/8611 257/373 |
| 6,043,699 A | * | 3/2000 | Shimizu | ........... H03K 3/356113 327/437 |

(Continued)

FOREIGN PATENT DOCUMENTS

KR   10-2019-0076874 A   7/2019

OTHER PUBLICATIONS

Office Action dated Jan. 29, 2025 issued in corresponding Korean Patent Application No. 10-2021-0032595.

*Primary Examiner* — Sophia T Nguyen
(74) *Attorney, Agent, or Firm* — MORGAN, LEWIS & BOCKIUS LLP

(57) ABSTRACT

A semiconductor device comprises a first wiring that receives an input signal and extends in a first direction, a first gate wiring that extends in a second direction that intersects the first direction, a first impurity region disposed on one side of the first gate wiring and is connected to the first wiring, a second impurity region disposed on an other side of the first gate wiring and is connected to the first wiring, a second gate wiring that extends in the second direction and is spaced apart from the first gate wiring in the first direction and is connected to the first wiring, and a first inverter that includes the second gate wiring and is connected to the first wiring through which the inverter receives the input signal.

8 Claims, 14 Drawing Sheets

(56) References Cited

U.S. PATENT DOCUMENTS

| | | | | |
|---|---|---|---|---|
| 6,366,113 B1* | 4/2002 | Song | H03K 3/356139 | 326/98 |
| 6,400,206 B2* | 6/2002 | Kim | H03K 3/356113 | 327/333 |
| 6,414,359 B1* | 7/2002 | Madan | H10B 10/12 | 257/E27.099 |
| 6,502,229 B2 | 12/2002 | Lee et al. | | |
| 6,885,609 B2* | 4/2005 | Lee | G11C 8/16 | 365/154 |
| 6,974,978 B1* | 12/2005 | Possley | H10D 84/90 | 257/E27.105 |
| 7,112,996 B2* | 9/2006 | Lee | H03K 3/356113 | 326/82 |
| 7,208,979 B2* | 4/2007 | Takiba | H03K 19/018521 | 326/83 |
| 7,262,651 B2* | 8/2007 | Kwon | H03F 3/45237 | 327/333 |
| 7,302,663 B1 | 11/2007 | Gan et al. | | |
| 7,388,410 B2* | 6/2008 | Kim | H03K 3/3565 | 327/108 |
| 7,394,155 B2* | 7/2008 | Liaw | H01L 27/0207 | 257/E21.59 |
| 7,410,843 B2* | 8/2008 | Jung | H10B 10/00 | 257/E27.099 |
| 7,554,361 B2* | 6/2009 | Kim | H03K 17/08122 | 326/71 |
| 7,764,475 B2* | 7/2010 | Sung | H01L 27/0266 | 361/91.1 |
| 7,880,501 B2* | 2/2011 | Han | H03K 3/356113 | 326/68 |
| 7,915,691 B2* | 3/2011 | Wong | H10B 10/00 | 257/392 |
| 7,924,604 B2* | 4/2011 | Yang | G11C 11/412 | 365/174 |
| 8,063,415 B2* | 11/2011 | Tsuda | H01L 27/0207 | 257/773 |
| 8,143,653 B2* | 3/2012 | Cho | G11C 13/004 | 257/260 |
| 8,194,371 B2 | 6/2012 | Tang et al. | | |
| 8,243,403 B2* | 8/2012 | Liang | H02H 9/046 | 361/111 |
| 8,357,955 B2* | 1/2013 | Tanaka | H01L 27/0207 | 326/103 |
| 8,446,175 B2* | 5/2013 | Aton | H01L 27/0207 | 326/103 |
| 8,595,661 B2* | 11/2013 | Kawa | H01L 29/41791 | 716/110 |
| 8,679,911 B2* | 3/2014 | Wang | H01L 27/0207 | 257/E21.585 |
| 8,741,763 B2* | 6/2014 | Ma | H01L 27/0207 | 438/599 |
| 8,847,329 B2* | 9/2014 | Becker | H10B 10/12 | 257/401 |
| 9,122,832 B2* | 9/2015 | Reed | G06F 30/398 | |
| 9,142,556 B2 | 9/2015 | Kito | | |
| 9,245,081 B2* | 1/2016 | Becker | H01L 27/088 | |
| 9,318,607 B2* | 4/2016 | Seo | H01L 23/5286 | |
| 9,460,259 B2* | 10/2016 | Baek | H01L 27/0207 | |
| 9,502,351 B1* | 11/2016 | Sahu | H01L 27/11807 | |
| 9,589,955 B2* | 3/2017 | Baek | H01L 27/0886 | |
| 9,613,714 B1* | 4/2017 | Wong | G11C 17/16 | |
| 9,646,711 B2* | 5/2017 | Choi | G11C 17/16 | |
| 9,646,960 B2* | 5/2017 | Baek | H10D 84/83 | |
| 9,698,056 B2* | 7/2017 | Kim | H01L 21/76892 | |
| 9,773,772 B2* | 9/2017 | Lee | H01L 23/5226 | |
| 9,831,877 B2* | 11/2017 | Lee | H03K 19/018521 | |
| 9,875,791 B2* | 1/2018 | Kwon | H10B 10/12 | |
| 10,050,032 B2* | 8/2018 | Baek | H10B 10/12 | |
| 10,128,255 B2* | 11/2018 | Lim | H10B 10/12 | |
| 10,270,430 B2* | 4/2019 | Guo | H03K 3/02332 | |
| 10,515,943 B2* | 12/2019 | Lee | H01L 27/11803 | |
| 10,541,237 B2* | 1/2020 | Baek | H01L 27/0207 | |
| 10,573,634 B2* | 2/2020 | Jeong | H01L 27/092 | |
| 10,600,785 B2* | 3/2020 | Rasouli | H01L 27/0921 | |
| 10,943,923 B2* | 3/2021 | Jeong | H01L 27/0207 | |
| 11,024,620 B2* | 6/2021 | Aton | H01L 27/0296 | |
| 11,050,424 B1* | 6/2021 | Nagarajan | H03K 19/018521 | |
| 11,322,443 B2* | 5/2022 | Zohrabyan | H01L 21/486 | |
| 11,424,251 B2* | 8/2022 | Kang | H01L 27/0207 | |
| 11,539,206 B2* | 12/2022 | Wang | H03K 17/0826 | |
| 11,557,582 B2* | 1/2023 | Kim | G06F 30/392 | |
| 11,632,101 B1* | 4/2023 | Beccue | H03K 3/356113 | 327/333 |
| 2003/0200071 A1* | 10/2003 | Zhang | G06F 30/367 | 703/15 |
| 2004/0174201 A1* | 9/2004 | Roberts | H03K 19/0027 | 327/333 |
| 2004/0207450 A1* | 10/2004 | Ando | H03K 3/35613 | 327/333 |
| 2005/0024088 A1* | 2/2005 | Lee | H03K 3/356113 | 326/81 |
| 2005/0138598 A1* | 6/2005 | Kokubun | H01L 27/118 | 257/E27.105 |
| 2006/0170052 A1* | 8/2006 | Kanamoto | H01L 27/11807 | 257/351 |
| 2007/0001197 A1 | 1/2007 | Ishikura | | |
| 2007/0162880 A1 | 7/2007 | Carlson et al. | | |
| 2007/0241810 A1* | 10/2007 | Onda | G11C 11/4094 | 327/544 |
| 2008/0036522 A1* | 2/2008 | Chung | H03K 3/35613 | 327/333 |
| 2009/0026546 A1* | 1/2009 | Shimada | H01L 27/11803 | 257/E27.06 |
| 2009/0189670 A1* | 7/2009 | Yang | H03K 19/018521 | 327/333 |
| 2010/0187609 A1* | 7/2010 | Moroz | H01L 27/0207 | 257/E27.06 |
| 2010/0277622 A1* | 11/2010 | Fossum | H04N 25/75 | 348/241 |
| 2011/0025734 A1* | 2/2011 | Jeon | H03K 19/018521 | 327/437 |
| 2012/0146988 A1* | 6/2012 | Tsuchi | G09G 3/3696 | 345/212 |
| 2013/0026571 A1* | 1/2013 | Kawa | G06F 30/392 | 257/E21.602 |
| 2013/0026572 A1* | 1/2013 | Kawa | H01L 29/41791 | 257/E21.602 |
| 2013/0329487 A1* | 12/2013 | Asayama | H10B 10/18 | 365/154 |
| 2014/0027918 A1* | 1/2014 | Rashed | H01L 27/11807 | 257/E21.59 |
| 2014/0217513 A1* | 8/2014 | Hayashi | H01L 27/0928 | 257/369 |
| 2014/0223395 A1* | 8/2014 | Moroz | G06F 30/392 | 716/54 |
| 2015/0014775 A1* | 1/2015 | Seo | H01L 29/785 | 257/351 |
| 2016/0118090 A1* | 4/2016 | Lee | G11C 7/1084 | 365/189.05 |
| 2016/0285452 A1* | 9/2016 | Lee | H03K 19/018521 | |
| 2017/0053696 A1* | 2/2017 | Jeong | G11C 7/18 | |
| 2017/0093401 A1* | 3/2017 | Lee | H01L 27/0207 | |
| 2017/0103699 A1* | 4/2017 | Lin | G09G 3/20 | |
| 2017/0125360 A1* | 5/2017 | Lee | H01L 23/573 | |
| 2017/0133367 A1* | 5/2017 | Baek | H01L 27/0207 | |
| 2017/0170075 A1* | 6/2017 | Jeon | H01L 21/823821 | |
| 2017/0222649 A1* | 8/2017 | Koo | H03K 19/00361 | |
| 2017/0294430 A1* | 10/2017 | Seo | H01L 23/528 | |
| 2017/0330614 A1* | 11/2017 | Kwon | H10B 10/00 | |
| 2018/0108646 A1* | 4/2018 | Lee | H01L 27/11803 | |
| 2018/0158811 A1* | 6/2018 | Subhash | H10B 10/18 | |
| 2018/0166119 A1* | 6/2018 | Jeong | G11C 5/063 | |
| 2018/0183414 A1* | 6/2018 | Guo | H03K 23/58 | |
| 2018/0294812 A1* | 10/2018 | Tan | H03K 19/017536 | |
| 2018/0342494 A1* | 11/2018 | Aton | H01L 27/0251 | |
| 2018/0342505 A1* | 11/2018 | Baek | H01L 21/845 | |
| 2019/0065659 A1* | 2/2019 | Biswas | G06F 30/398 | |
| 2019/0067263 A1* | 2/2019 | Ge | G06F 30/34 | |
| 2019/0148407 A1* | 5/2019 | Guo | H01L 27/11807 | 257/206 |

(56) References Cited

U.S. PATENT DOCUMENTS

| | | |
|---|---|---|
| 2019/0198507 A1* | 6/2019 | Nii .................... G11C 11/412 |
| 2019/0198529 A1 | 6/2019 | Yadoguchi et al. |
| 2019/0214394 A1* | 7/2019 | Bai .................... H10B 10/18 |
| 2019/0393205 A1* | 12/2019 | Lee .................... G06F 30/392 |
| 2019/0393877 A1* | 12/2019 | Ribeiro do Nascimento ............. H03K 3/35613 |
| 2020/0050731 A1 | 2/2020 | Yu et al. |
| 2020/0051611 A1* | 2/2020 | Jeong ................ G11C 11/4087 |
| 2020/0059228 A1* | 2/2020 | Parthasarathy .. H03K 17/04123 |
| 2020/0075478 A1* | 3/2020 | Kim .................... G11C 5/02 |
| 2020/0143876 A1* | 5/2020 | Nakamura .......... G11C 11/417 |
| 2020/0144245 A1* | 5/2020 | Mittal .................. H10D 89/10 |
| 2020/0152627 A1* | 5/2020 | Baek .................. H01L 23/528 |
| 2021/0104463 A1* | 4/2021 | Lee .................... H01L 23/5283 |
| 2021/0104611 A1* | 4/2021 | Yu .................... H01L 29/66795 |
| 2021/0225425 A1* | 7/2021 | Do .................... G11C 11/40615 |
| 2022/0020738 A1* | 1/2022 | Lai .................... H01L 23/5226 |
| 2022/0084959 A1* | 3/2022 | Kim .................. H01L 23/528 |
| 2022/0108989 A1* | 4/2022 | Kang ................ G11C 11/412 |
| 2022/0238081 A1* | 7/2022 | Jung .................. G09G 3/3688 |
| 2022/0246623 A1* | 8/2022 | Hwang ............ H01L 21/823828 |
| 2022/0270969 A1* | 8/2022 | Baek .................. H01L 23/5386 |
| 2022/0293584 A1* | 9/2022 | Chae .................. H01L 27/0255 |
| 2023/0027769 A1* | 1/2023 | Park .................. H01L 29/66772 |
| 2023/0100170 A1* | 3/2023 | Beccue .......... H03K 19/018521 327/333 |

* cited by examiner

1

100

110

99

300

SEMICONDUCTOR DEVICE

This application claims priority under 35 USC § 119 from Korean Patent Application No. 10-2021-0032595, filed on Mar. 12, 2021 in the Korean Intellectual Property Office, the contents of which are herein incorporated by reference in their entirety.

BACKGROUND

1. Technical Field

Embodiments of the present disclosure are directed to a semiconductor device.

2. Discussion of the Related Art

An antenna effect is a phenomenon in which charge accumulates in a long wiring in an etching process of a metal wiring layer of a semiconductor device. For example, when a metal wiring layer is etched with plasma, if an amount of charge stored in a gate electrode connected to long wiring increases, the insulation of a gate insulating film may be destroyed, and a leak current may be generated.

Therefore, a diode cell should be properly place to block charge from flowing into the wiring so that the charge is not stored in the gate electrode through the wiring.

SUMMARY

Embodiments of the present disclosure provide a semiconductor device that has improved product reliability while facilitating routing.

According to some embodiments of the present inventive concept, there is provided a semiconductor device that includes a first wiring that receives an input signal and extends in a first direction, a first gate wiring that extends in a second direction that intersects the first direction, a first impurity region disposed on one side of the first gate wiring and is connected to the first wiring, a second impurity region disposed on an other side of the first gate wiring and is connected to the first wiring, a second gate wiring that extends in the second direction and is spaced apart from the first gate wiring in the first direction and is connected to the first wiring, and a first inverter that includes the second gate wiring and is connected to the first wiring through which the inverter receives the input signal.

According to some embodiments of the present inventive concept, there is provided a semiconductor device that includes a first wiring that receives an input signal and extends in a first direction, a first gate wiring that extends in a second direction that intersects the first direction; a first impurity region disposed on one side of the first gate wiring and is connected to the first wiring, a second impurity region disposed on an other side of the first gate wiring and is connected to the first wiring, a second wiring that receives a power supply voltage and extends in the first direction, a third impurity region disposed on one side of the first gate wiring, is spaced apart from the first impurity region in the second direction and is connected to one of the first wiring or the second wiring, a fourth impurity region disposed on an other side of the first gate wiring, is spaced apart from the second impurity region in the second direction, and is connected to one of the first wiring or the second wiring, and an inverter connected to the first wiring through which the inverter receives the input signal.

According to some embodiments of the present inventive concept, there is provided a semiconductor device that includes a diode buffer cell that includes a substrate on which an active region is defined, and a tap cell that is spaced apart from the diode buffer cell and grounds the substrate. The diode buffer cell includes a first wiring that is disposed on the active region, receives an input signal, and extends in a first direction, a first gate wiring that is disposed on the active region and extends in a second direction that intersects the first direction, a first impurity region that is disposed in the active region on one side of the first gate wiring and is connected to the first wiring, a second impurity region that is disposed in the active region on an other side of the first gate wiring and is connected to the first wiring, and a buffer connected to the first wiring.

According to some embodiments of the present inventive concept, there is provided a semiconductor device that includes a first wiring that receives an input signal and extends in a first direction, a first gate wiring that extends in a second direction that intersects the first direction, a second gate wiring that extends in the second direction and spaced apart from the first gate wiring in the first direction, and connected to the first wiring, a first inverter that includes the second gate wiring and is connected to the first wiring through which the first inverter receives the input signal, a third gate wiring that extends in the second direction, and is spaced apart from the second gate wiring in the first direction, a second inverter that includes the third gate wiring, a second wiring that transmits an output of the first inverter to the second inverter, and a third wiring that transmits an output of the second inverter to an output terminal. A width in the second direction of the third wiring is greater than a width in the second direction of the second wiring.

DETAILED DESCRIPTION

Hereinafter, embodiments based on the technical idea of the present disclosure will be described with reference to the accompanying drawings.

Figure 1:
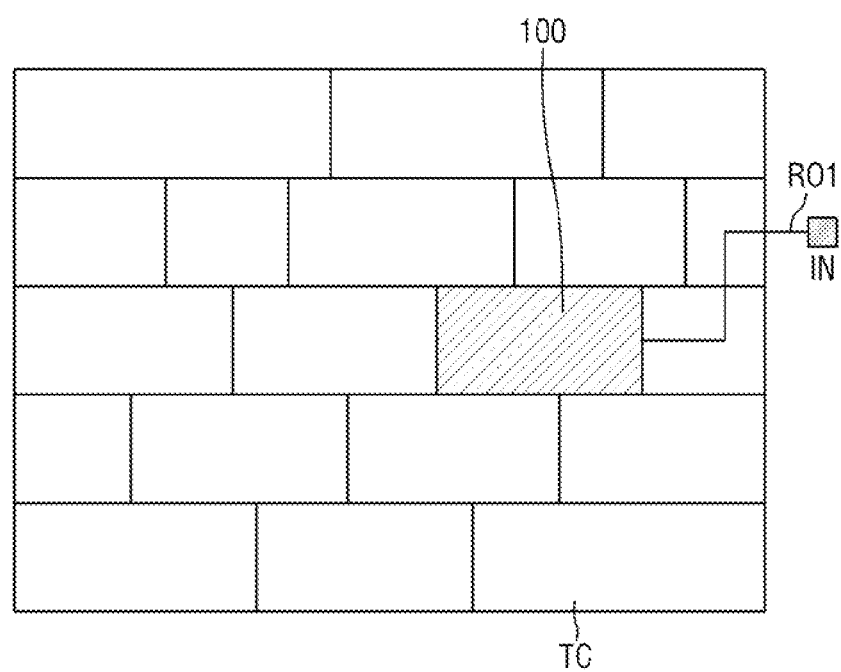
FIG. 1 is a conceptual diagram of a semiconductor device according to some embodiments.

FIG. 1 is a conceptual diagram of a semiconductor device according to some embodiments.

Referring to FIG. 1, in some embodiments, a semiconductor device 1 includes a plurality of cells. At least one of the plurality of cells in the semiconductor device 1 is a diode buffer cell 100. That is, the semiconductor device 1 includes at least one diode buffer cell 100.

In some embodiments, the diode buffer cell 100 includes a buffer that stores data and a diode that prevents an antenna effect. That is, in the semiconductor device 1 according to a present embodiment, the buffer cell and the diode cell are not implemented by being separated into separate cells, but rather the buffer and the diode are integrated and implemented in a single cell.

In some embodiments, a routing wiring RO1 connects an input terminal IN to which an input signal is provided and the diode buffer cell 100.

Further, in some embodiments, the semiconductor device 1 includes at least one tap cell Tc. The tap cell TC may be spaced apart from the diode buffer cell 100, as shown, or may be placed adjacent to the diode buffer cell 100.

In some embodiments, the tap cell TC grounds a substrate placed in the diode buffer cell 100. That is to say, if a substrate is placed over the diode buffer cell 100 and the tap cell TC, the substrate is grounded inside the tap cell TC, which is located outside the diode buffer cell 100, rather than inside the diode buffer cell 100. A substrate placed in the diode buffer cell 100 may also be grounded due to such a tap cell TC.

Hereinafter, the diode buffer cell 100 according to some embodiments will be described referring to FIGS. 2 to 8.

Figure 2:
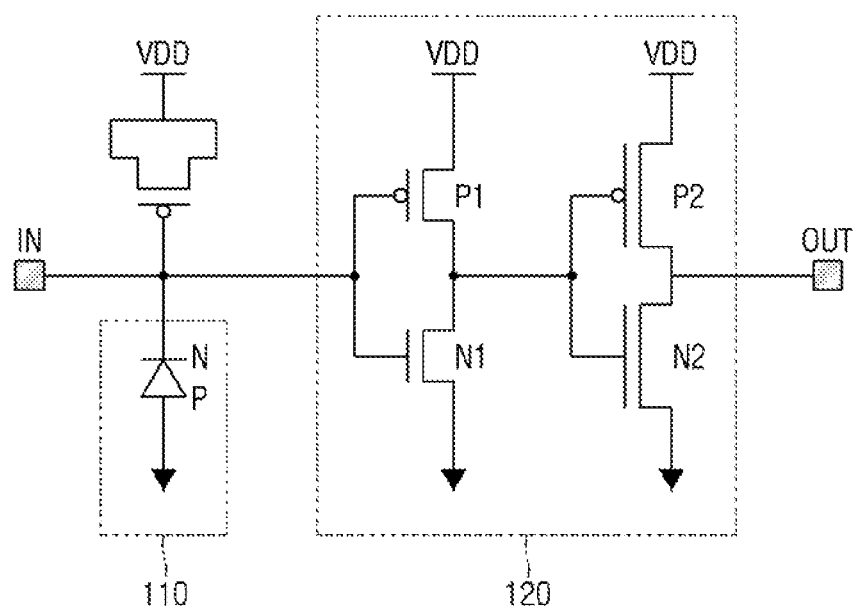
FIG. 2 is a circuit diagram of a diode buffer cell of FIG. 1.
Figure 3:
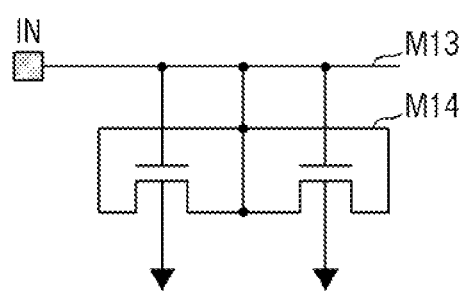
FIG. 3 is a circuit diagram of a diode of FIG. 2.
Figure 4:
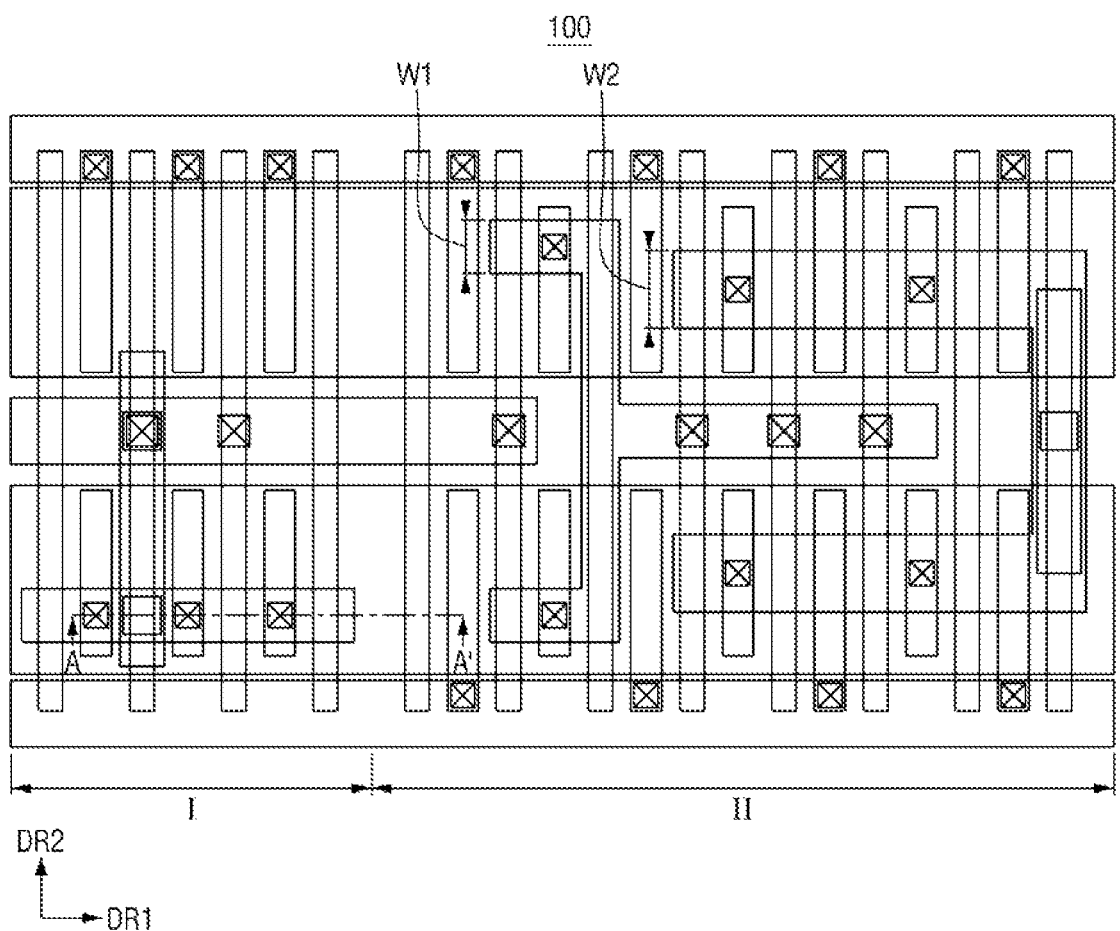
FIG. 4 is a layout of a diode buffer cell of FIG. 1.
Figure 5:
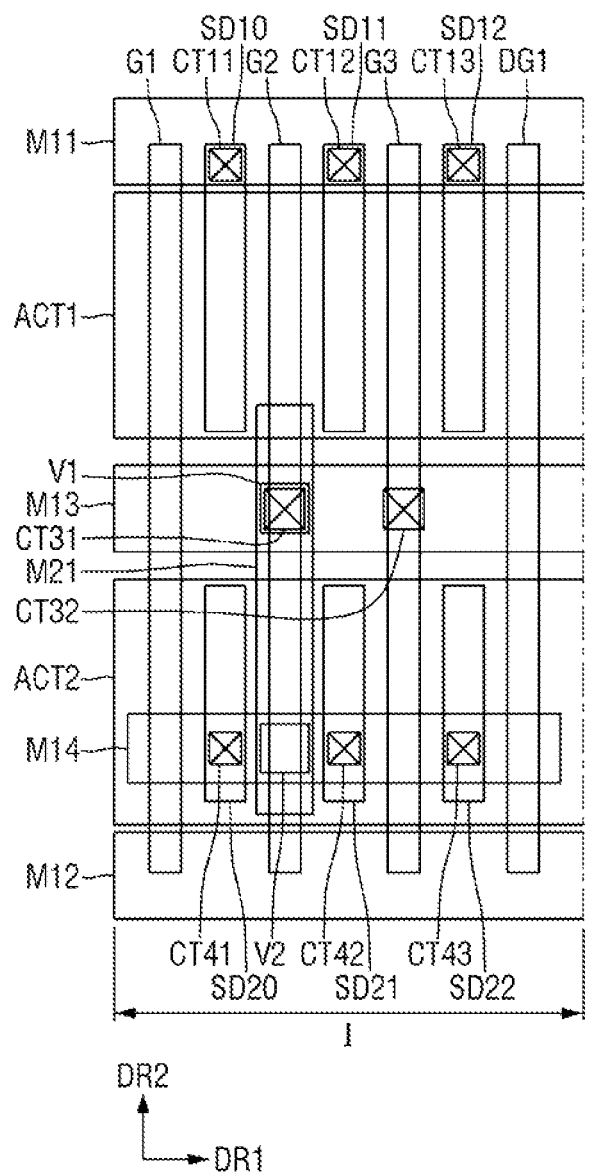
FIG. 5 is a layout of a region I of FIG. 4.
Figure 6:
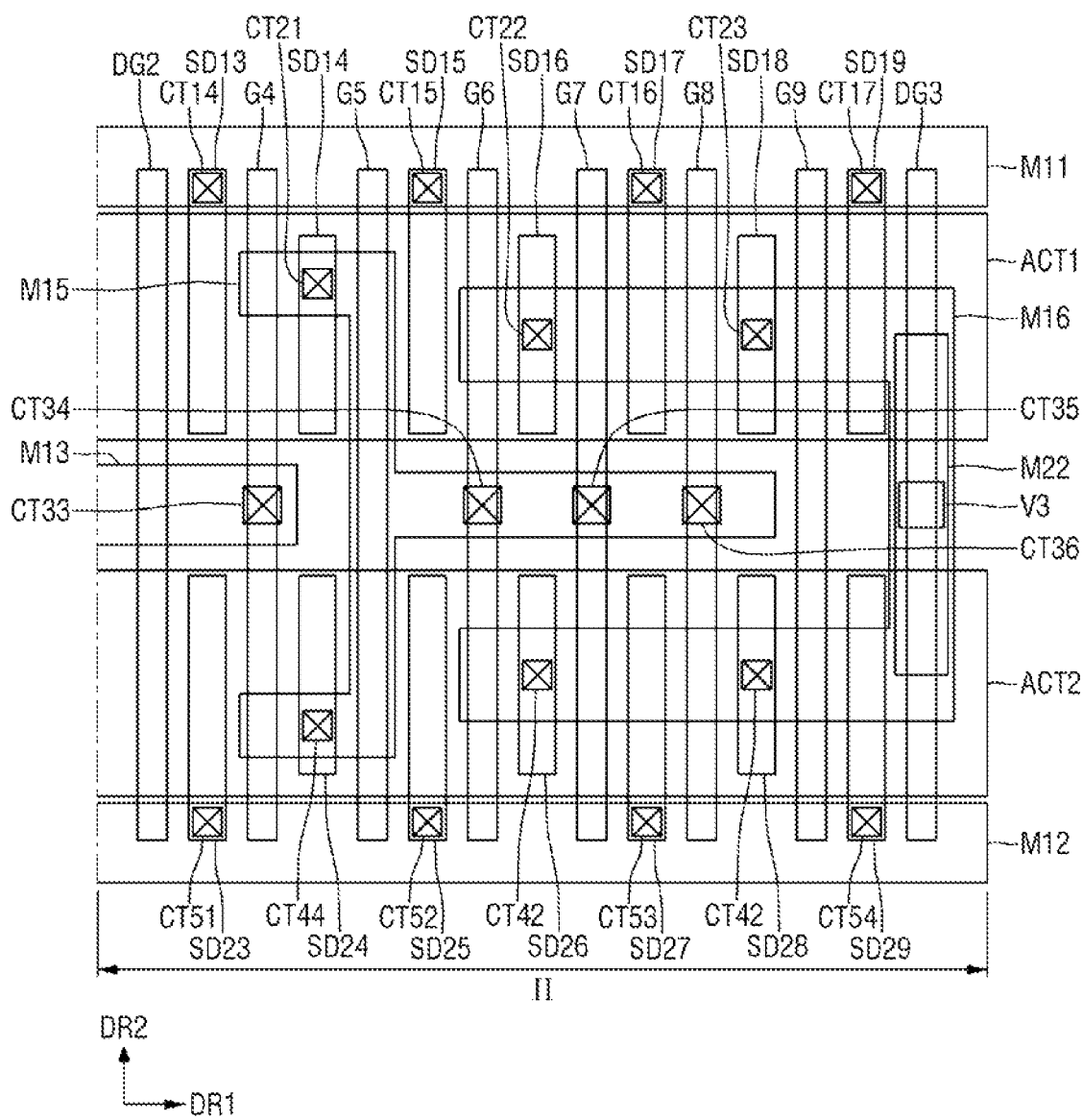
FIG. 6 is a layout of a region II of FIG. 4.
Figure 7:
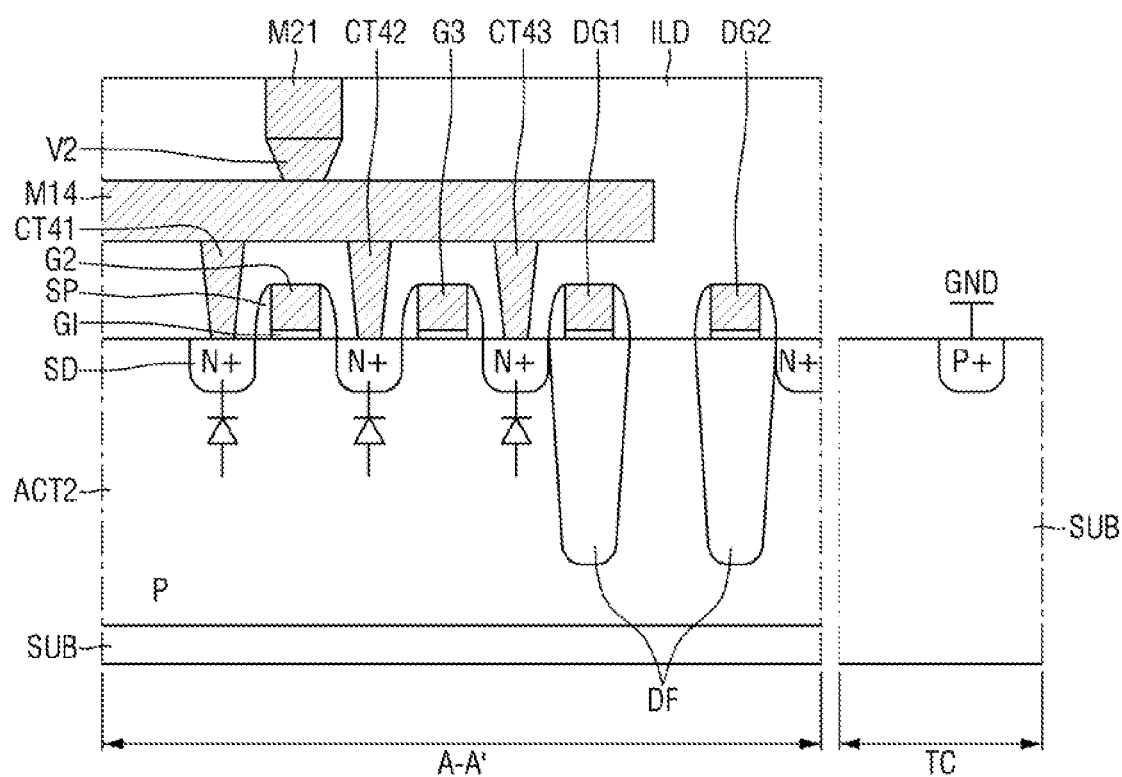
FIG. 7 is a cross-sectional view taken along line A-A' of FIG. 4.
Figure 8:
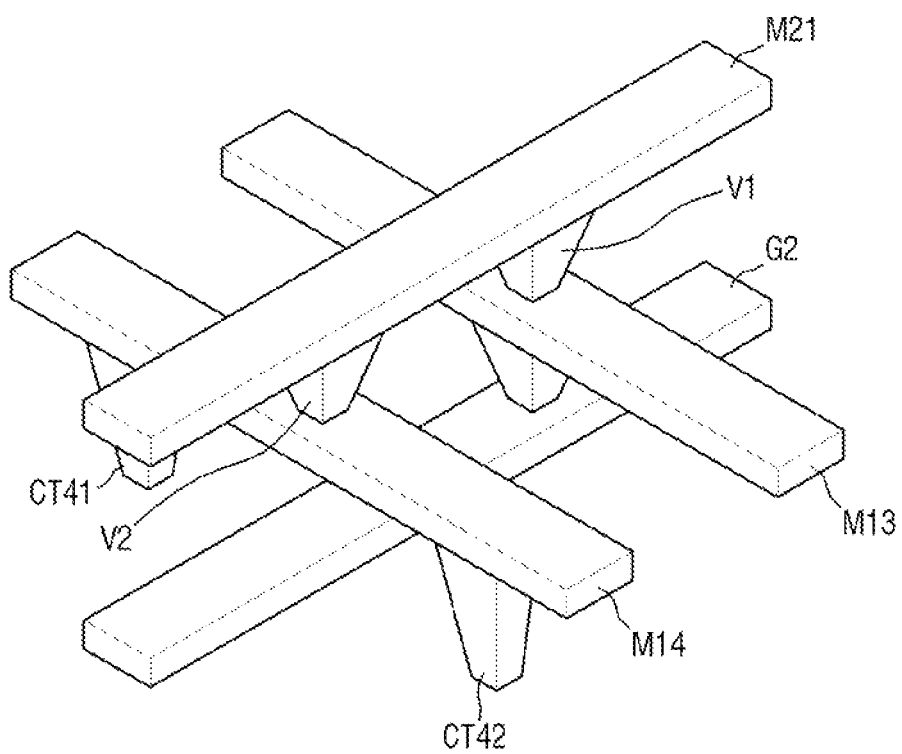
FIG. 8 illustrates a connection relationship between wirings in a layout of FIG. 4.

FIG. 2 is a circuit diagram of a diode buffer cell of FIG. 1. FIG. 3 is a circuit diagram of a diode of FIG. 2. FIG. 4 is a layout of a diode buffer cell of FIG. 1. FIG. 5 is a layout of a region I of FIG. 4. FIG. 6 is a layout of a region II of FIG. 4. FIG. 7 is a cross-sectional view taken along line A-A' of FIG. 4. FIG. 8 illustrates a connection relationship between wirings in a layout of FIG. 4.

First, referring to FIG. 2, in some embodiments, the diode buffer cell 100 includes a diode 110 and a buffer 120.

In some embodiments, the buffer 120 includes a first inverter that includes a transistor P1 and a transistor N1, and a second inverter that includes a transistor P2 and a transistor N2. However, embodiments are not limited thereto, and in other embodiments, the buffer can include more inverters than those shown.

In some embodiments, the sizes of the transistor P2 and the transistor N2 are greater than the sizes of the transistor P1 and the transistor N1. Therefore, the drive strength of the second inverter is greater than the drive strength of the first inverter.

In some embodiments, the diode 110 is placed to prevent an antenna effect. The operation of a diode will be more specifically described below.

Referring to FIGS. 2 to 8, in some embodiments, active regions ACT1 and ACT2 are formed on the substrate SUB inside the diode buffer cell 100.

The substrate SUB may be bulk silicon or SOI (silicon-on-insulator). Alternatively, the substrate SUB may be a silicon substrate or may include other substances, such as silicon germanium, SGOI (silicon germanium on insulator), indium antimonide, lead tellurium compounds, indium arsenide, phosphide indium, gallium arsenide or gallium antimonide. However, embodiments of the technical idea of the present disclosure are not limited thereto.

In some embodiments, the active region ACT1 and the active region ACT2 are separated from each other in a second direction DR2.

In some embodiments, each of the active region ACT1 and the active region ACT2 protrudes from the substrate SUB in a third direction perpendicular to a first direction DR1 that crosses the second direction DR2 and the second direction DR2. Each of the active region ACT1 and the active region ACT2 is defined by an element isolation region. For example, the element isolation region is disposed on an element isolation trench formed between the active region ACT1 and the active region ACT2.

In some embodiments, a first fin type pattern that intersects the active region ACT1 and extends in the first direction DR1 is disposed on the active region ACT1. The first fin type pattern protrudes from the active region ACT1 in the third direction.

Further, in some embodiments, a second fin type pattern that intersects the active region ACT2 and extends in the first direction DR1 is disposed on the active region ACT2. The second fin type pattern protrudes from the active region Act2 in the third direction.

In some embodiments, gate wirings G1 to G9 and dummy gate wirings DG1 to DG3 extend in the second direction DR2 on the active region ACT1 and the active region ACT2. The respective gate wirings G1 to G9 and the dummy gate wirings DG1 to DG3 are separated from each other in the first direction DR1.

In some embodiments, the gate wirings G1 to G9 include a conductor. The gate wiring G1 to G9 include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or combinations thereof. The gate wirings G1 to G9 may include a conductive metal oxide, a conductive metal oxynitride, etc., and may include an oxidized form of the above-mentioned substances.

In some embodiments, the dummy gate wirings DG1 to DG3 include different substances from the gate wirings G1 to G9. In some embodiments, the dummy gate wiring DG1 to DG3 may include polysilicon or an insulator, however, embodiments are not limited thereto.

In addition, in some embodiments, the dummy gate wirings DG1 to DG3 include the same substances as the gate wirings G1 to G9.

In some embodiments, the dummy gate wirings DG1 to DG3 do not function as gate electrodes of the transistor, unlike the gate wirings G1 to G9.

Referring to FIG. 7, in some embodiments, a gate insulating film GI is disposed below the gate wirings G1 to G9 and the dummy gate wirings DG1 to DG3. The gate insulating film GI includes, for example, at least one of silicon oxide, silicon oxynitride, silicon nitride or a high dielectric constant material that has a higher dielectric constant than silicon oxide. The high dielectric constant materials include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

In some embodiments, the gate insulating film G1 extends to the top along the side wall of a spacer SP disposed on the side surfaces of the gate wirings G1 to G9 and the dummy gate wirings DG1 to DG3.

In some embodiments, the spacer SP include, for example, at least one of silicon nitride (SiN), silicon oxynitride (SiON), silicon oxide (SiO$_2$), silicon carbonitride (SiCN), silicon oxycarbonitride (SiOCN), silicon boronitride (SiBN), silicon oxyboronitride (SiOBN), or silicone oxycarbide (SiOC), or combinations thereof. In some embodiments, the spacer SP has an L shape.

Referring to FIGS. 2 to 8, impurity regions SD10 to SD19 are disposed in the active region ACT1, and impurity regions SD20 to SD29 are disposed in the active region ACT2. The impurity regions SD10 to SD19 and SD20 to SD29 function as a source or drain of a transistor.

In some embodiments, the active region ACIl includes n-type impurities, and the impurity regions SD10 to SD19 include p-type impurities or impurities that prevent diffusion of p-type impurities. As a result, the gate wirings G1 to G9 and the impurity regions SD10 to SD19 form a plurality of PMOS transistors. The impurity regions SD10 to SD19 include, for example, at least one of B, C, In, Ga, or Al, or a combination thereof, however, embodiments are not limited thereto.

In some embodiments, the active region ACT2 includes p-type impurities, and the impurity regions SD20 to SD29 include n-type impurities or an impurity that prevents diffusion of n-type impurities. As a result, the gate wirings G1 to G9 and the impurity regions SD20 to SD29 form a plurality of NMOS transistors. The impurity regions SD20 to SD29 include, for example, at least one of P. Sb, or As, or a combination thereof, however, embodiments are not limited thereto.

FIG. 7 shows an embodiment in which the impurity regions SD10 to SD19 and the impurity regions SD20 to SD29 are a single film, however, embodiments of the technical idea of the present disclosure are not limited thereto. In other embodiments, the impurity regions SD10 to SD19 and the impurity regions SD20 to SD29 are formed of multi-layer films that contain impurities of different concentrations from each other.

In some embodiments, a wiring M11 extends in the first direction DR1. A power supply voltage VDD is transmitted to the wiring M11.

In some embodiments, the wiring M11 is connected to the impurity regions SD10, SD11, SD12, SD13, SD15, SD17, and SD19. Specifically, the wiring M11 is connected to the impurity region SD10 through a contact CT11, connected to the impurity region SD11 through a contact CT12, and connected to the impurity region SD12 through a contact CT13. Further, the wiring M11 is connected to the impurity region SD13 through a contact CT14, connected to the impurity region SD15 through a contact CT15, connected to the impurity region SD17 through a contact CT16, and connected to the impurity region SD19 through the contact CT17. Accordingly, the power supply voltage VDD may be applied to the impurity regions SD10, SD11, SD12, SD13, SD15, SD17, and SD19 through the wiring MI I.

In some embodiments, a wiring M12 extends in the first direction DR1. The wiring M12 is grounded GND.

In some embodiments, the wiring M12 is connected to the impurity regions SD23, SD25, SD27, and SD29. Specifically, the wiring M12 is connected to the impurity region SD23 through a contact CT51, connected to the impurity region SD25 through a contact CT52, connected to the impurity region SD27 through a contact CT53, and connected to the impurity region SD29 through a contact CT54. Therefore, the impurity regions SD23, SD25, SD27, and SD29 are grounded through the wiring M12.

On the other hand, in some embodiments, the impurity regions SD20, SD21 and SD22 are not connected to the wiring M12. That is, the impurity regions SD20, SD21 and SD22 are not grounded through the wiring M12.

In some embodiments, a wiring M13 is connected to an input terminal IN. Accordingly, an input signal can be transmitted from the input terminal IN through the wiring M13.

In some embodiments, the wiring M13 is placed higher than the gate wirings G1 to G9 and the dummy gate wirings DG1 to DG3. Specifically, the wiring M13 extends in the first direction DR1, and overlaps the gate electrodes G1 to G4 and the dummy gate electrodes DG1 and DG2.

In some embodiments, the wiring M13 is connected to the gate wiring G2, the gate wiring G3, and the gate wiring G4. Specifically, the wiring M13 is connected to the gate wiring G2 through a contact CT31, connected to the gate wiring G3 through a contact CT32, and connected to the gate wiring G4 through a contact. CT33.

In some embodiments, a wiring M4 is connected to the impurity regions SD20, SD21 and SD22. Specifically, the wiring M14 is connected to the impurity region SD20 through a contact CT41, connected to the impurity region SD21 through a contact CT42, and connected to the impurity region SD22 through a contact CT43.

In some embodiments, the wiring M14 is placed at substantially the same height as the wiring M13. That is, the wiring M14 is placed higher than the gate wirings G1 to G9 and the dummy gate wirings DG to DG3. Specifically, the wiring M14 extends in the first direction DR1, and overlaps the gate electrodes G1 to G3 and the dummy gate electrode DG1.

In some embodiments, a wiring M15 connects the impurity region SD14 and the impurity region SD24 with the gate wirings G6, G7, and G8. Specifically, the wiring M15 is connected to the impurity region SD14 through a contact CT21, connected to the impurity region SD24 through a contact CT44, connected to the gate wiring G6 through a contact CT34, connected to the gate wiring G7 through a contact CT35, and connected to the gate wiring G7 through a contact CT36. The wiring M15 transmits the output of the aforementioned first inverter to the second inverter.

In some embodiments, a wiring M16 connects the impurity region SD16, the impurity region SD18, the impurity region SD26, and the impurity region SD28 to the wiring M22. Specifically, the wiring M16 is connected to the impurity region SD16 through a contact CT22, connected to the impurity region SD18 through a contact CT23, connected to the impurity region SD26 through a contact CT42, connected to the impurity region SD28 through a contact CT42, and connected to the wiring M22 through a via V3. The wiring M16 transmits the output of the aforementioned second inverter to an output terminal OUT connected to the wiring M22.

In some embodiments, the wiring M13, the wiring M15 and the wiring M16 are placed at substantially the same height.

In some embodiments, the wiring M22 is placed higher than the wiring M13, the wiring M15 and the wiring M16. The wiring M22 is connected to the output terminal OUT.

In some embodiments, a wiring M21 is placed higher than the wiring M13 and the wiring M14. The wiring M21 extends in the second direction DR2. The wiring M21 is connected to the wiring M13 by a via V1 and is connected to the wiring M14 by a via V2.

In some embodiments, an interlayer insulating film ILD is disposed between the wirings, contacts and vias. The interlayer insulating film ILD includes, for example, at least one of silicon oxide, silicon oxynitride or a low dielectric constant (low-k) material that has a lower dielectric constant than silicon oxide, however, embodiments are not limited thereto.

In some embodiments, a diode 110 is disposed in the first region I, and a buffer 120 is disposed in the second region II In some embodiments, the buffer 120 includes a first inverter that includes the gate wiring G4 and the impurity region SD13, SD14, SD23, and SD24, and a second inverter that includes the gate wirings G6, G7, and G8 and the impurity regions SD15 to SD18 and SD25 to 28. In a present embodiment, since the drive strength of the second inverter is greater than the drive strength of the first inverter, a width W2 of the wiring M16 in the second direction DR2 is greater than a width W1 of the wiring M15 in the second direction DR2.

In some embodiments, the first region I and the second region II are divided into two dummy gate wirings DG1 and DG2. An isolation region DF that divides the first region I and the second region II is disposed below each of the two dummy gate wirings DG1 and DG2.

Although the drawing shows an example in which two dummy gate wirings DG1 and DG2 are placed between the first region I and the second region II, embodiments are not limited thereto. In some embodiments, one dummy gate wiring and the isolation region are disposed between the first region I and the second region II to divide the first region I and the second region II.

Referring to FIGS. 3, 5 and 7, in some embodiments, the substrate SUB in which the active region ACT2 is placed is grounded by tap cell TC as described above. Further, in the diode buffer cell 100, the active region ACT2, and the impurity regions SD20, SD21, and SD22 are not grounded. Accordingly, the p-type active region ACT2 and the n-type impurity regions SD20, SD21, and SD22 function as the diode. That is to say, since the active region ACT2, the substrate SUB, and the impurity regions SD20, SD21, and SD22 function as a diode between the wirings M13, an antenna effect in which charge accumulates in the wiring M13 and other wirings connected to the wiring M13 from the substrate SUB is prevented.

Figure 9:
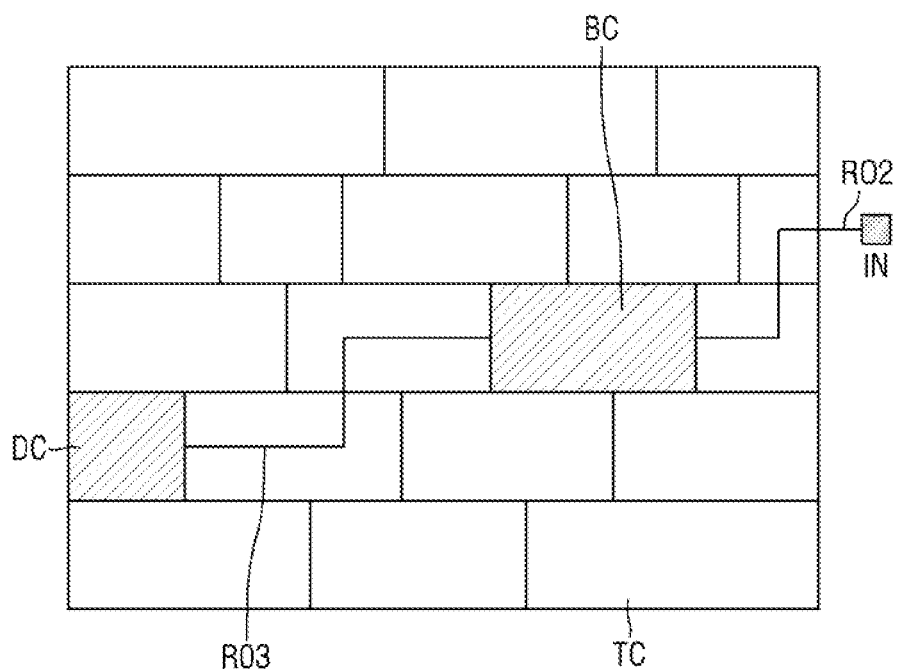
FIG. 9 illustrates a semiconductor device according to some embodiments.

FIG. 9 illustrates an effect of a semiconductor device according to some embodiments.

Specifically, FIG. 9 illustrates a semiconductor device 99 in which a buffer cell BC and a diode cell DC are separated. As described above, the diode cell DC to the buffer cell BC should be connected to eliminate the antenna effect. However, as shown, when the buffer cell BC and the diode cell DC are placed separately, a plurality of routing wirings RO2 and RO3 are needed, which increases the complexity of the design.

However, in a present embodiment, since the p-type active region ACT2 and the n-type impurity regions SD20, SD21, and SD22 placed between the substrate SUB and the wiring M13 are used as a diode to embody both the diode and the buffer in a single cell, a semiconductor device can be provided with easy routing and improved product reliability.

Hereinafter, a diode buffer cell of a semiconductor device according to some embodiments will be described referring to FIGS. 10 to 12.

Figure 10:
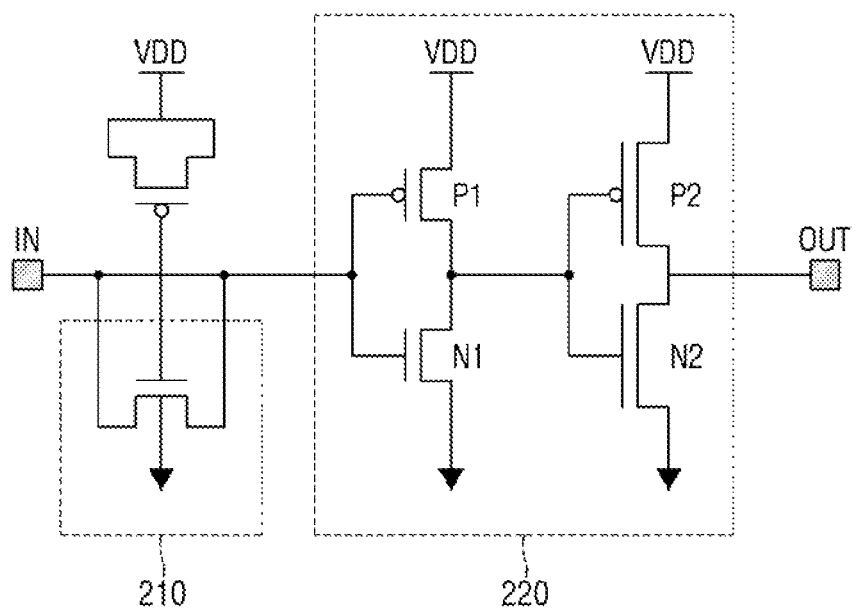
FIG. 10 is a circuit diagram of a diode buffer cell of a semiconductor device according to some embodiments.

FIG. 10 is a circuit diagram of the diode buffer cell of a semiconductor device according to some embodiments. FIG. 11 illustrates a layout of a semiconductor device diode buffer cell according to some embodiments. FIG. 12 illustrates a layout of a region I of FIG. 11.

Hereinafter, repeated description of features described above will be omitted and differences will be mainly described.

Figure 11:
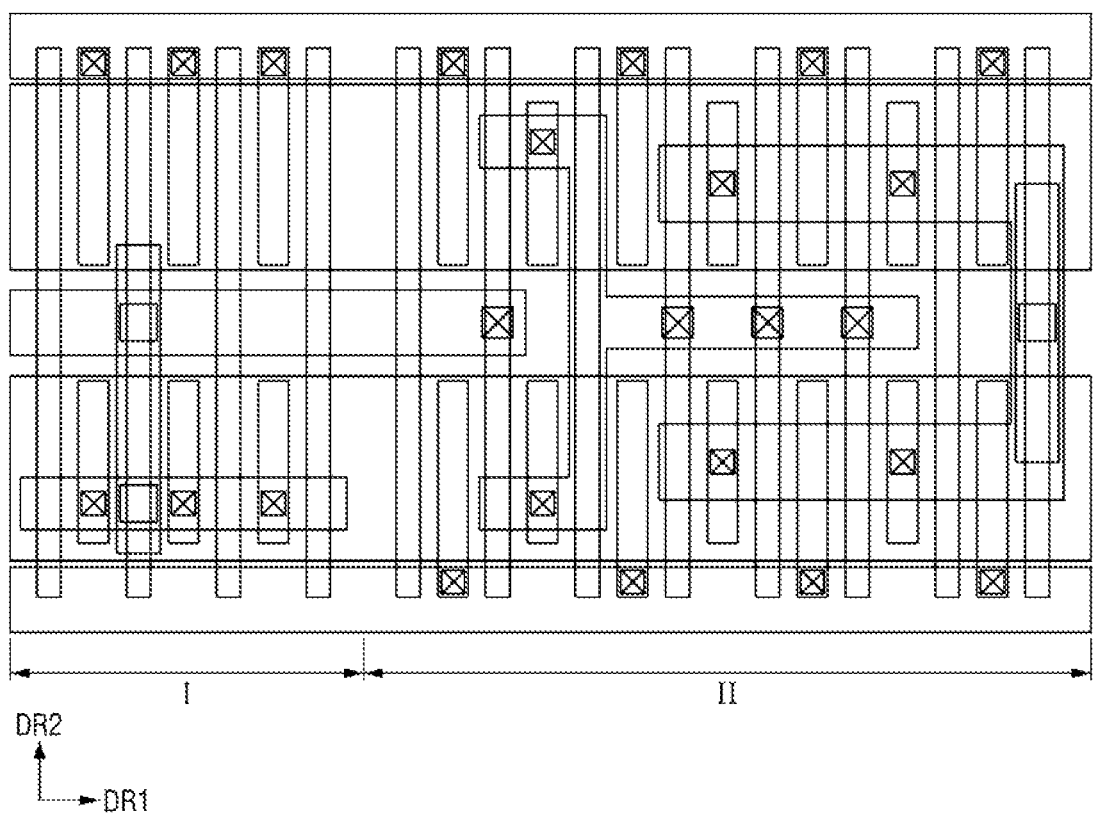
FIG. 11 illustrates a layout of a semiconductor device diode buffer cell according to some embodiments.
Figure 12:
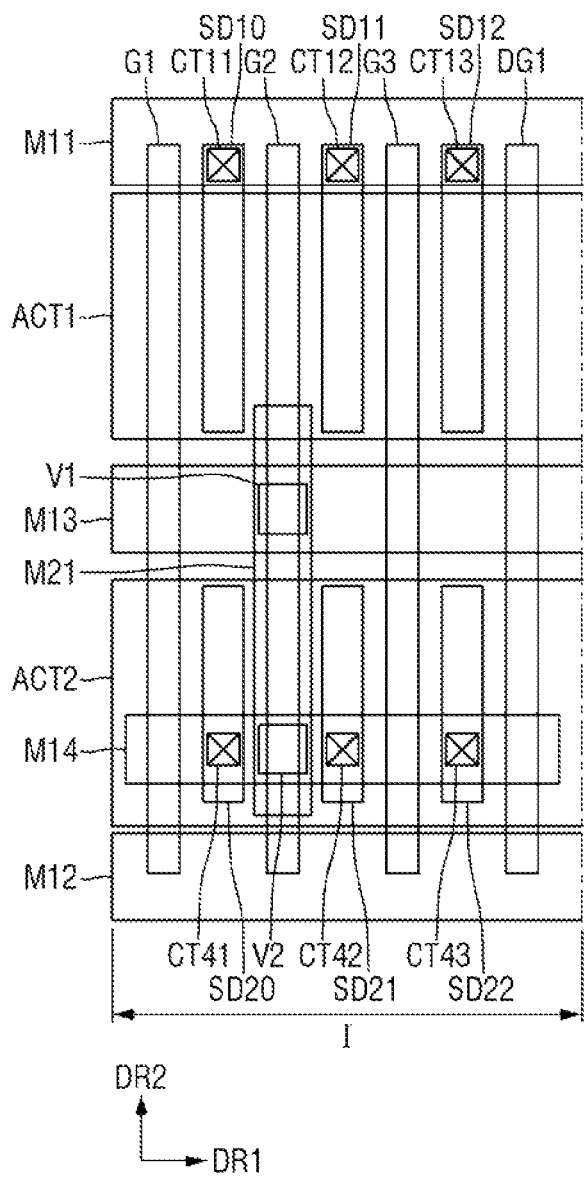
FIG. 12 illustrates a layout of a region I of FIG. 11.

Referring to FIGS. 10 to 12, in some embodiments, a diode buffer cell 200 includes a diode 210 and a buffer 220.

In a present embodiment, the wiring M13 of the diode buffer cell 200 is not connected to the gate wiring G2 and the gate wiring G3.

In some embodiments, although the wiring M13 is connected to the gate wiring G2 through the contact CT31, and connected to the gate wiring G3 through the contact CT32 in an above-described embodiment, the contacts CT31 and CT32 described above are not present in an embodiment of FIGS. 10 to 12. Accordingly, the gate wiring G2 and the gate wiring G3 floats by not being connected to the wiring M13. Accordingly, an input capacitance is reduced.

Hereinafter, a diode buffer cell of a semiconductor device according to some embodiments will be described referring FIGS. 13 to 15.

Figure 13:
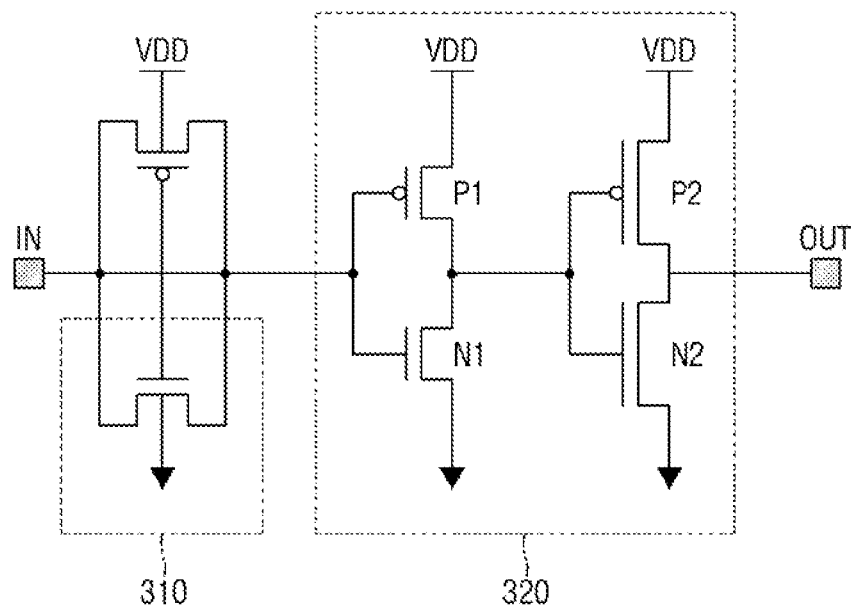
FIG. 13 is a circuit diagram of a diode buffer cell of a semiconductor device according to some embodiments.

FIG. 13 is a circuit diagram of a diode buffer cell of a semiconductor device according to some embodiments. FIG. 14 illustrates a layout of a diode buffer cell of a semiconductor device according to some embodiments. FIG. 15 illustrates a layout of a region I of FIG. 14.

Hereinafter, repeated description of the features described above will be omitted and differences will be mainly described.

Figure 14:
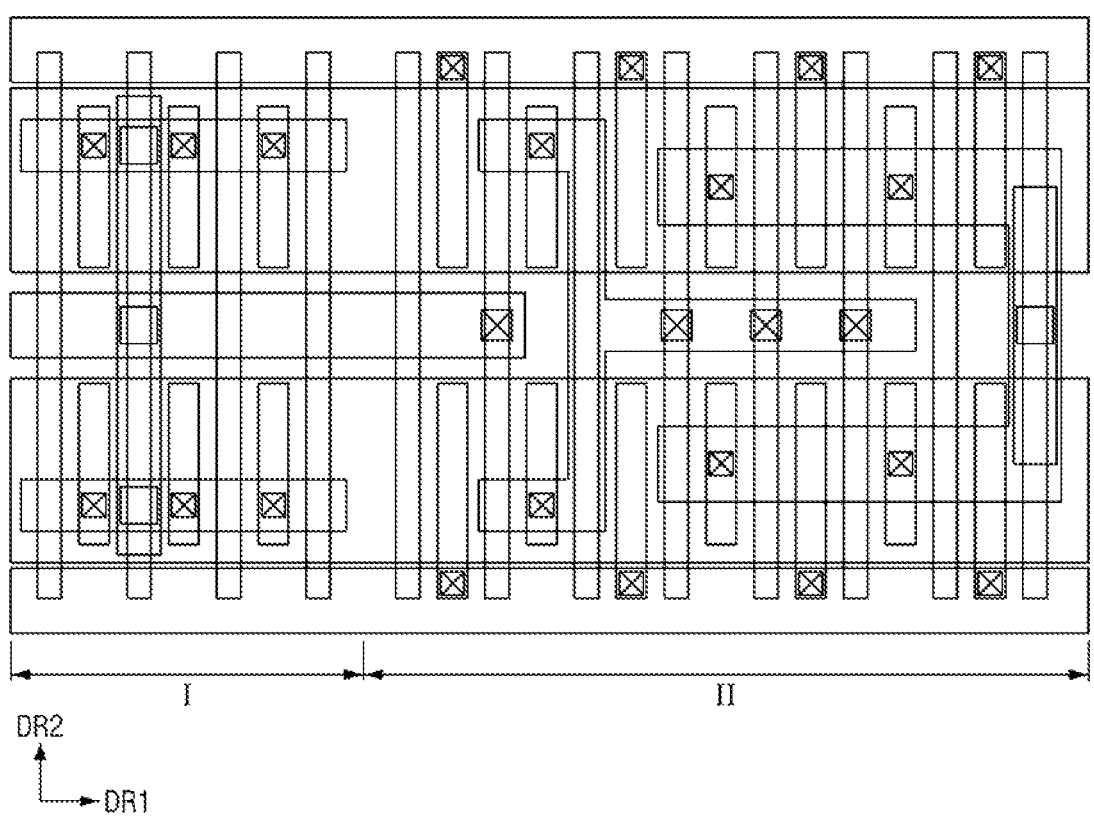
FIG. 14 illustrates a layout of a diode buffer cell of a semiconductor device according to some embodiments.
Figure 15:
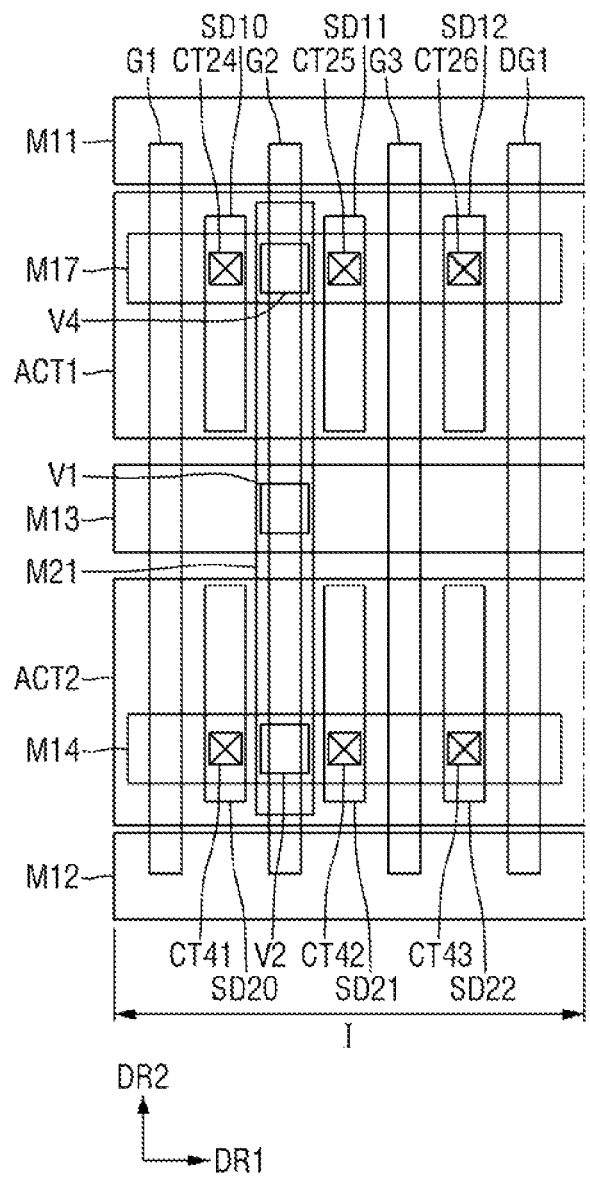
FIG. 15 illustrates a layout of a region I of FIG. 14.

Referring to FIGS. 13 to 15, in some embodiments, a diode buffer cell 300 includes a diode 310 and a buffer 320.

In some embodiments, the diode buffer cell 300 further includes a wiring M17 connected to the impurity regions SD10, SD11, and SD12. That is, unlike an above-described embodiment, the impurity regions SD10, SD11, and SD12 of the diode buffer cell 300 according to a present embodiment are not connected to the wiring M11 that receives the power supply voltage VDD.

In some embodiments, the wiring M17 is connected to the impurity region SD10 through the contact CT24, connected to the impurity region SD11 through the contact CT25, and connected to the impurity region SD12 through the contact CT26.

In some embodiments, the wiring M17 is disposed at substantially the same height as the wiring M13. That is, the wiring M17 is disposed higher than the gate wirings G1 to G9 and the dummy gate wirings DG1 to DG3. Specifically, the wiring M17 extends in the first direction DR1, and overlaps the gate electrodes G1 to G3 and the dummy gate electrode DG1.

In some embodiments, the wiring M21 are placed higher than the wiring M13, the wiring M14 and the wiring M17. The wiring M21 extends in the second direction DR2. The wiring M21 is connected to the wiring M13 by the vias V1, connected to the wiring M14 by the via V2, and connected to the wiring M17 by a via V4.

In some embodiments, the impurity regions SD10, SD11 and SD12, and the impurity regions SD20, SD21 and SD22 are connected to each other by the wiring M13, the wiring M21, the wiring M14, and the wiring M17. Further, the impurity regions SD10, SD11, and SD12 and the impurity regions SD20, SD21, and SD22 are connected to the input terminal IN through the wiring M13.

In some embodiments, the wiring M13 is not connected to the gate wiring G2 and the gate wiring G3. Accordingly, the gate wiring G2 and the gate wiring G3 floats by not being connected to the wiring M13.

In concluding the detailed description, those skilled in the art will appreciate that many variations and modifications may be made to embodiments without substantially departing from the principles of the present disclosure. Therefore, disclosed embodiments of the disclosure are used in a generic and descriptive sense only and not for purposes of limitation.

What is claimed is:

1. A semiconductor device, comprising:
a first wiring that receives an input signal and extends in a first direction;
a first gate wiring that extends in a second direction that intersects the first direction;
a first impurity region disposed in a first active region on one side of the first gate wiring and is connected to the first wiring;
a second impurity region disposed in the first active region on an other side of the first gate wiring and is connected to the first wiring, wherein the second impurity region is spaced apart from the first impurity region in the first direction;
a second gate wiring that extends in the second direction and spaced apart from the first gate wiring in the first direction, and connected to the first wiring;
a first inverter that includes the second gate wiring and is connected to the first wiring through which the first inverter receives the input signal;
a second wiring that extends in the second direction, is disposed higher than the first wiring, and is connected to the first wiring; and
a third wiring that extends in the first direction, is disposed lower than the second wiring, and is connected to the second wiring,
wherein the first and second impurity regions are connected to the third wiring.

2. The semiconductor device of claim 1, wherein the first gate wiring is connected to the first wiring.

3. The semiconductor device of claim 2, further comprising:
a fourth wiring connected to a power supply voltage and that extends in the first direction;
a third impurity region disposed on one side of the first gate wiring, is spaced apart from the first impurity region in the second direction, and is connected to the fourth wiring; and
a fourth impurity region disposed on an other side of the first gate wiring, is spaced apart from the second impurity region in the second direction, and is connected to the fourth wiring.

4. The semiconductor device of claim 1, further comprising:
a plurality of third gate wirings that extend in the second direction, and are spaced apart from the second gate wiring in the first direction;

a second inverter that includes the plurality of third gate wirings;
a fifth wiring that transmits an output of the first inverter to the second inverter; and
a sixth wiring that transmits an output of the second inverter to an output terminal,
wherein a width in the second direction of the sixth wiring is greater than a width in the second direction of the fifth wiring.

5. The semiconductor device of claim 4, wherein the fifth wiring and the sixth wiring are disposed higher than the plurality of third gate wirings.

6. A semiconductor device, comprising:
a first wiring that receives an input signal and extends in a first direction;
a first gate wiring that extends in a second direction that intersects the first direction;
a first impurity region disposed in a first active region on one side of the first gate wiring and is connected to the first wiring;
a second impurity region disposed in the first active region on an other side of the first gate wiring and connected to the first wiring, wherein the second impurity region is spaced apart from the first impurity region in the first direction;
a fourth wiring that receives a power supply voltage and extends in the first direction;
a third impurity region disposed in a second active region on one side of the first gate wiring and is spaced apart from the first impurity region in the second direction;
a fourth impurity region disposed in the second active region on an other side of the first gate wiring and is spaced apart from the second impurity region in the second direction and from the third impurity region in the first direction; and
an inverter connected to the first wiring through which the inverter receives the input signal;
a buffer connected to the first wiring;
a second wiring that extends in the second direction, is disposed higher than the first wiring, and is connected to the first wiring, and
a third wiring that extends in the first direction, is disposed lower than the second wiring, and is connected to the second wiring,
wherein the first and second impurity regions are connected to the third wiring, and
the first gate wiring is connected to the first wiring.

7. The semiconductor device of claim 6, wherein the third and fourth impurity regions are connected to the fourth wiring.

8. A semiconductor device, comprising:
a diode buffer cell that includes a substrate on which an active region is defined; and
a tap cell that is spaced apart from the diode buffer cell and grounds the substrate,
wherein the diode buffer cell comprises:
a first wiring that is disposed on the active region, receives an input signal, and extends in a first direction;
a first gate wiring that is disposed on the active region and extends in a second direction that intersects the first direction;
a first impurity region that is disposed in the active region on one side of the first gate wiring, and is connected to the first wiring;
a second impurity region that is disposed in the active region on an other side of the first gate wiring, and is connected to the first wiring;

a buffer connected to the first wiring;
a second wiring that extends in the second direction, is disposed higher than the first wiring, and is connected to the first wiring, and
a third wiring that extends in the first direction, is disposed lower than the second wiring, and is connected to the second wiring,
wherein the first and second impurity regions are connected to the third wiring, and
the first gate wiring is connected to the first wiring.

* * * * *